(12) United States Patent
Sugito et al.

(10) Patent No.: US 11,360,123 B2
(45) Date of Patent: Jun. 14, 2022

(54) CURRENT SENSOR

(71) Applicant: DENSO CORPORATION, Kariya (JP)

(72) Inventors: Tatsuaki Sugito, Kariya (JP); Takeshi Tsukamoto, Kariya (JP); Takuma Esaka, Kariya (JP); Ryosuke Sakai, Kariya (JP); Akito Sasaki, Kariya (JP); Hatsuomi Isogai, Kariya (JP); Hiroaki Miwa, Kariya (JP); Hiroshi Nomura, Kariya (JP); Takashi Ishikawa, Kariya (JP); Katsunori Michiyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/001,960

(22) Filed: Aug. 25, 2020

(65) Prior Publication Data

US 2020/0386794 A1    Dec. 10, 2020

Related U.S. Application Data

(63) Continuation of application No. PCT/JP2019/011313, filed on Mar. 19, 2019.

(30) Foreign Application Priority Data

May 18, 2018  (JP) .............................. JP2018-095979

(51) Int. Cl.
*G01R 15/20*  (2006.01)
*G01R 19/00*  (2006.01)

(52) U.S. Cl.
CPC ....... *G01R 15/205* (2013.01); *G01R 19/0092* (2013.01)

(58) Field of Classification Search
CPC .................................................. G01R 19/0092
See application file for complete search history.

(56) References Cited

U.S. PATENT DOCUMENTS

| 2007/0164727 | A1* | 7/2007 | Racz | G01R 15/207 324/235 |
| 2011/0224937 | A1 | 9/2011 | Nishimura | |
| 2011/0298454 | A1* | 12/2011 | Ausserlechner | G01R 19/00 324/252 |
| 2012/0206225 | A1 | 8/2012 | Misaki | |

(Continued)

FOREIGN PATENT DOCUMENTS

| JP | H03-146874 A | 6/1991 |
| JP | 2006-058120 A | 3/2006 |

(Continued)

*Primary Examiner* — Dominic E Hawkins
(74) *Attorney, Agent, or Firm* — Posz Law Group, PLC

(57) ABSTRACT

The current sensor has a conductive member through which a current to be measured flows in a predetermined direction, and a magneto electric converter facing and spaced apart from the conductive member in an intersecting direction intersecting the predetermined direction. An opposing portion of the conductive member facing the magneto electric converter has an annular shape in which two tip surfaces face each other via a gap around the predetermined direction. The magneto electric converter is opposed to the hollow portion, arranged in the opposing portion having an annular shape, in the intersecting direction via the gap.

6 Claims, 8 Drawing Sheets

(56) References Cited

U.S. PATENT DOCUMENTS

| | | | |
|---|---|---|---|
| 2013/0113463 A1* | 5/2013 | Fukuyama | G01R 19/0092 |
| | | | 324/117 R |
| 2014/0097933 A1 | 4/2014 | Yoshioka et al. | |
| 2014/0225593 A1 | 8/2014 | Nakajima et al. | |
| 2014/0232376 A1* | 8/2014 | Yasui | G01R 15/207 |
| | | | 324/127 |
| 2015/0260762 A1* | 9/2015 | Sakamoto | G01R 3/00 |
| | | | 324/117 R |
| 2016/0169941 A1 | 6/2016 | Fukui | |
| 2018/0321281 A1* | 11/2018 | Fukuhara | G01R 15/207 |

FOREIGN PATENT DOCUMENTS

| | | |
|---|---|---|
| JP | 4515855 B2 | 8/2010 |
| JP | 4726092 B2 | 7/2011 |
| JP | 2011-196709 A | 10/2011 |
| JP | 2012-117948 A | 6/2012 |
| JP | 2013-002901 A | 1/2013 |
| JP | 2013-117447 A | 6/2013 |
| JP | 2015-148470 A | 8/2015 |
| JP | 2015-179043 A | 10/2015 |

* cited by examiner

CURRENT SENSOR

CROSS REFERENCE TO RELATED APPLICATION

The present application is a continuation application of International Patent Application No. PCT/JP2019/011313 filed on Mar. 19, 2019, which designated the U.S. and claims the benefit of priority from Japanese Patent Application No. 2018-095979 filed on May 18, 2018. The entire disclosures of all of the above applications are incorporated herein by reference.

TECHNICAL FIELD

The present disclosure relates to an electric current sensor that detects a current to be measured.

BACKGROUND

There is known a current measuring device in which a magnetic sensor is disposed between a center position and an end position of a conductor to be measured so as to face the conductor having flat shape in consideration of a variation of a current density due to a skin effect.

SUMMARY

According to an example embodiment, a current sensor has a conductive member through which a current to be measured flows in a predetermined direction, and a magneto electric converter facing and spaced apart from the conductive member in an intersecting direction intersecting the predetermined direction. An opposing portion of the conductive member facing the magneto electric converter has an annular shape in which two tip surfaces face each other via a gap around the predetermined direction. The magneto electric converter is opposed to the hollow portion, arranged in the opposing portion having an annular shape, in the intersecting direction via the gap.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Due to the skin effect, the current flows intensively at the end position of the flat measurement object conductor. On the other hand, in a conceivable configuration, the magnetic sensor is disposed to face the measurement object conductor having the flat shape between one position (i.e., an end position) of the plurality of end portions of the measurement object conductor and the center position thereof. Therefore, a magnetic field generated from a current flowing intensively at other end portions of the measurement object conductor hardly passes through the magnetic sensor. Therefore, the configuration described above cannot effectively increase the density of the magnetic field transmitted through the magnetic sensor (specifically, a magneto electric conversion unit).

In view of the above points, a current sensor is provided such that the density of a magnetic field transmitted through a magneto electric conversion unit is effectively increased.

According to an aspect of an example embodiment, a current sensor includes a conductive member through which a current to be measured flows in a predetermined direction, and a magneto electric converter facing and spaced apart from the conductive member in an intersecting direction intersecting the predetermined direction. A facing portion of the conductive member facing the magneto electric converter has an annular shape with two end surfaces facing each other around the predetermined direction via a gap. The magneto electric converter is opposed to the hollow portion arranged between the facing surfaces formed in an annular shape in the intersecting direction via the gap.

As described above, the magneto electric converter is disposed to face the gap between the two end surfaces of the conductive member. With this configuration, when an alternating current to be measured flows through the conductive member, the measurement object magnetic field generated from the measurement object current that flows intensively on the surface layers on the two end surfaces of the conductive member due to the skin effect passes through the magneto electric converter. As a result, the density of the magnetic field to be measured passing through the magneto electric converter is effectively increased.

Embodiments will be described below with reference to the drawings.

First Embodiment

The current sensor 100 detects an alternating current. For example, the current sensor 100 is arranged on an energizing bus bar that connects an in-vehicle inverter and a stator coil of a motor. The current sensor 100 detects an alternating current (specifically, three-phase alternating current) flowing through the energizing bus bar.

Figure 1:
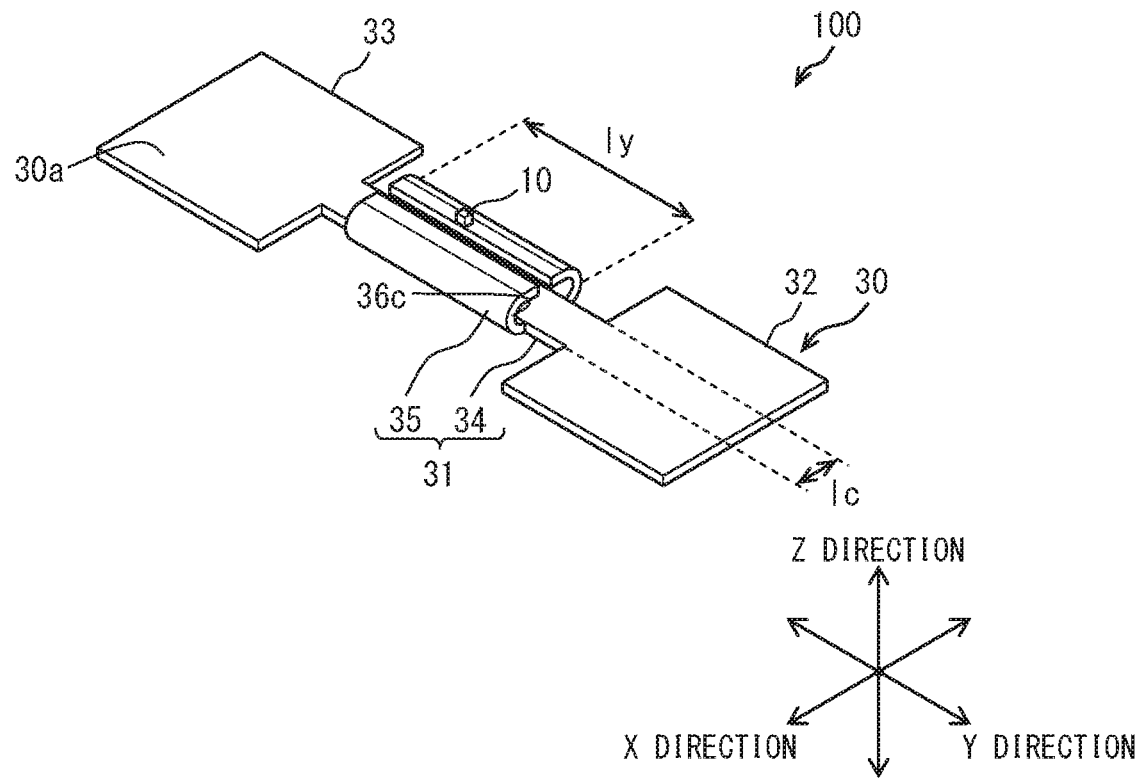
FIG. 1 is a perspective view showing a current sensor.
Figure 2:
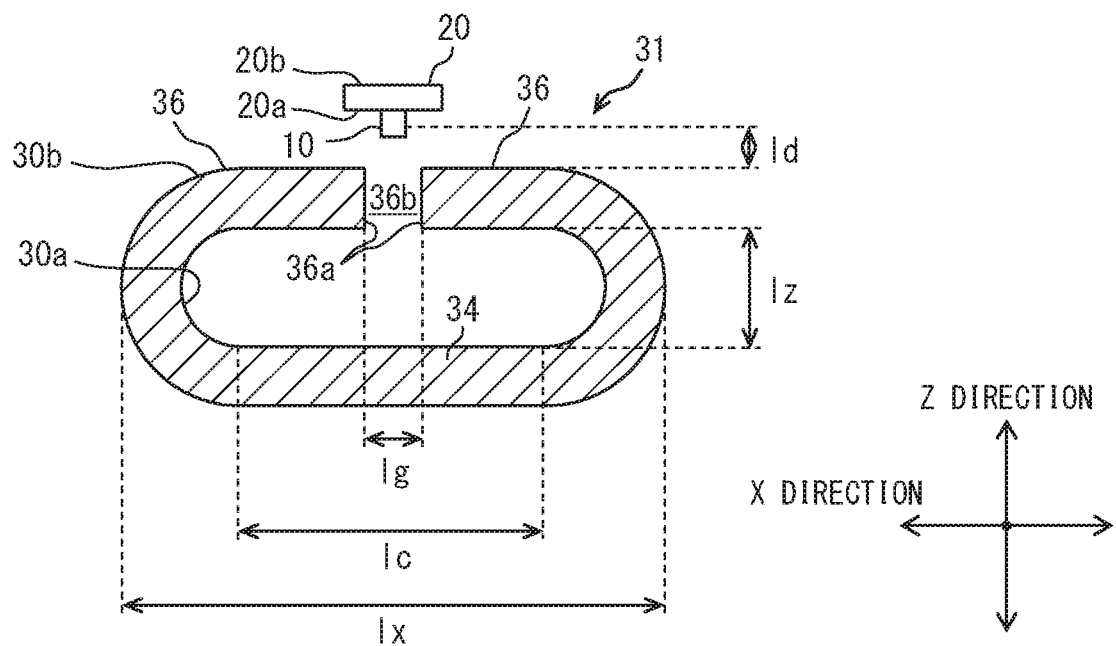
FIG. 2 is a cross sectional view of a current sensor.

As shown in FIG. 1, the current sensor 100 has a magneto electric converter 10 and a conductive bus bar 30. Further, as shown in FIG. 2, the current sensor 100 has a wiring board 20 on which the magneto electric converter 10 is mounted.

The conductive bus bar 30 is a part of the above-described energizing bus bar. Therefore, the three-phase alternating current flows through the conductive bus bar 30. Note that the conductive bus bar 30 and the energizing bus bar may be separated from each other. For example, in the case of a configuration in which the energizing bus bar is divided into the inverter side and the stay coil side, a configuration in which the conductive bus bar 30 is bridged therebetween can be adopted.

The magneto electric converter 10 and the wiring board 20 are arranged to face the conductive bus bar 30. As a result, a magnetic field generated from an alternating current flowing through the conductive bus bar 30 passes through the magneto electric converter 10. The magneto electric converter 10 converts the magnetic field transmitted through the converter 10 into an electric signal.

Hereinafter, components of the current sensor 100 will be individually described. Three directions orthogonal to one another are referred to as an X-direction, a Y-direction, and a Z-direction. The x direction corresponds to the horizontal direction. The y direction corresponds to a predetermined direction. The z direction corresponds to the intersecting direction.

<Magneto Electric Converter>

The magneto electric converter 10 is included in an ASIC (not shown). The ASIC is mounted on the wiring board 20. The ASIC is an abbreviation of Application Specific Integrated Circuit.

The ASIC includes an amplifier circuit and the like in addition to the magneto electric converter 10 therein. A filter circuit and the like are mounted on the wiring board 20. The signal strength of the electric signal output from the magneto electric converter 10 is amplified by an amplifier circuit. The noise included in the electric signal of the magneto electric converter 10 whose signal strength is amplified is removed by the filter circuit. The electric signal of the magneto electric converter 10, in which the signal intensity of the signal is amplified and the noise is removed, is output to the in-vehicle electronic control unit. The electronic control unit determines a target value (i.e., a target torque) of the torque generated in the motor based on the electric signal, the output of a rotation angle sensor (not shown), and the like.

The wiring board 20 has a flat plate shape with a small thickness in the z direction as shown in FIG. 2. The wiring board 20 has a first main surface 20a and a second main surface 20b opposing in the z direction. An ASIC (with a magnetic-electric converter 10) is mounted on the first main surface 20a. The first main surface 20a is arranged to face the conductive bus bar 30 in the z direction. Thus, the magneto electric converter 10 is arranged to face the conductive bus bar 30 in the z direction.

The magneto electric converter 10 has a plurality of magneto-resistive elements whose resistance values change according to a magnetic field (i.e., a transmission magnetic field) transmitting therethrough. The resistance of the magneto-resistive element changes according to the transmitted magnetic field along the first main surface 20a. That is, the resistance of the magneto-resistive element changes according to the component of the transmitted magnetic field along the x direction and the component along the y direction.

On the other hand, the resistance of the magneto-resistive element does not change due to the transmitted magnetic field along the z direction. Therefore, even when an external noise along the z direction passes through the magneto-resistive element, the resistance of the magneto-resistive element does not change.

The magneto-resistive element has a pinned layer having a fixed magnetization direction, a free layer whose magnetization direction changes according to a transmission magnetic field, and a nonmagnetic intermediate layer arranged between two layers. When the intermediate layer has non-conductivity, the magneto-resistive element is defined as a giant magneto-resistive element. When the intermediate layer has conductivity, the magneto-resistive element is defined as a tunnel magneto-resistive element. The magneto-resistive element may be an anisotropic magneto-resistance effect element (AMR). Alternatively, the magneto electric converter 10 may have a Hall element instead of the magneto-resistive element.

The resistance of the magneto-resistive element changes depending on the angle between the magnetization directions of the pinned layer and the free layer. The magnetization direction of the pinned layer is along the first main surface 20a. The magnetization direction of the free layer is determined by the transmission magnetic field along the first main surface 20a. The resistance of the magneto-resistive element becomes minimum when the magnetization directions of the free layer and the fixed layer are parallel to each other. The resistance of the magneto-resistive element becomes maximum when the magnetization directions of the free layer and the fixed layer are antiparallel to each other.

The magneto electric converter 10 has a plurality of the above-described magneto-resistance effect elements. A bridge circuit is formed by the plurality of magneto-resistive elements. The output of the bridge circuit fluctuates due to the transmission of a magnetic field through the magneto-resistive element. The output of the bridge circuit is input into the amplifier circuit.

The magneto electric converter 10 may include an operational amplifier and a feedback coil for generating a cancellation magnetic field, in addition to a bridge circuit including a magneto-resistance effect elements. The output terminal of the bridge circuit is connected to the input terminal of the operational amplifier. A feedback coil is connected to the output terminal of the operational amplifier. The output terminal and the input terminal of the operational amplifier are connected via a feedback circuit. With the configuration described above, the operational amplifier operates so that the current flowing through the input terminal and the current flowing through the output terminal become zero. As a result, a current (i.e., a feedback current) flows from the output terminal of the operational amplifier according to the transmission magnetic field of the magneto-resistive element.

This feedback current flows through the feedback coil. As a result, a cancellation magnetic field is generated from the feedback coil. This cancellation magnetic field passes through the bridge circuit. Thus, the magnetic field to be measured that passes through the bridge circuit is cancelled. As described above, the magneto electric converter 10 operates so that the measurement object magnetic field transmitted therethrough and the cancellation magnetic field are balanced. As the magneto electric converter 10, such a magnetic balance type converter may be adopted. In the case of this configuration, the voltage applied to the feedback coil is output to the amplifier circuit as the output voltage of the magneto-electric converter 10.

<Conductive Bus Bar>

The conductive bus bar 30 is made of a conductive material such as copper, brass, and aluminum. The conductive busbar 30 may be manufactured, for example, in the manner listed below. The conductive bus bar 30 may be manufactured by pressing a flat plate. The conductive bus bar 30 may be manufactured by integrally connecting a plurality of flat plates. The conductive busbar 30 may be manufactured by welding a plurality of flat plates. The conductive busbar 30 may be manufactured by pouring a molten conductive material into a mold. The method of manufacturing the conductive bus bar 30 is not particularly limited. The conductive bus bar 30 corresponds to a conductive member.

As shown in FIGS. 1 and 2, the conductive bus bar 30 extends in the y direction. The conductive bus bar 30 has an opposing portion 31 opposing the magneto electric converter 10 in the z direction, and a first connection portion 32 and a second connection portion 33 connected to the opposing portion 31. The first connection portion 32 and the second connection portion 33 are arranged in the y direction via the opposing portion 31. The first connection portion 32 and the second connection portion 33 are integrally connected via the opposing portion 31. The opposing portion 31 corresponds to a facing portion.

The conductive bus bar 30 of the present embodiment is manufactured by pressing a flat plate having a uniform length (i.e., an uniform thickness) between the one surface 30a and the back surface 30b. Therefore, the separation distance between the one surface 30a and the back surface 30b of each of the opposing portion 31, the first connection portion 32, and the second connection portion 33 is equal to each other.

Each of the first connection portion 32 and the second connection portion 33 provides a rectangular shape on a plane perpendicular to the z direction. The one surface 30a and the back surface 30b of each of the first connection portion 32 and the second connection portion 33 are perpendicular to the z direction.

The opposing portion 31 has a narrow portion 34 extending in the y direction. The one surface 30a and the back surface 30b of the narrow portion 34 are perpendicular to the z direction. One of the two ends of the narrow portion 34 in the y direction is integrally connected to the first connection portion 32. The other of the two ends of the narrow portion 34 in the y direction is integrally connected to the second connection portion 33. As a result, a current flowing through the first connection portion 32 and the second connection portion 33 flows through the narrow portion 34.

The narrow portion 34 is shorter in the x direction than the first connection portion 32 and the second connection portion 33. For this reason, the density of the current flowing in each of the connection portion between the narrow portion 34 and the first connection portion 32 and the connection portion between the narrow portion 34 and the second connection portion 33 is higher than the density of the current flowing through the first connection portion 32 and the second connection portion 33.

The opposing portion 31 has an annular portion 35 that forms an annular shape in the circumferential direction around the y direction together with the narrow portion 34 in addition to the narrow portion 34 described above. The annular portion 35 has two extension portions 36 bending and extending from the two side surfaces of the narrow portion 34 arranged in the x-direction to an upper side of the one surface 30a of the narrow portion 34. The two extension portions 36 extend in the semicircular shape along the circumferential direction from the side surface of the narrow portion 34, and then extend in the x direction such that the tip surfaces 36a of the two extension portions 36 approach each other.

The tip surface 36a of each of these two extension portions 36 is perpendicular to the x direction. The two tip surfaces 36a are opposed to each other while being separated from each other in the x direction. Thereby, a gap 36b is formed between the two tip surfaces 36a.

The tip surface 36a may have a shape inclined with respect to the x direction. As the formation of the inclination, a feature in which the tip surface 36a faces the hollow in the z direction and a feature in which the tip surface 36a faces the wiring board 20 in the z direction may be adopted. In these cases, the thickness of the tip portion having the tip surface 36a in the z direction gradually increases as the distance from the gap increases.

The gap 36b and the two tip surfaces 36a constituting the gap 36b are arranged to be spaced apart from the one surface 30a of the narrow portion 34 in the z direction. The gap 36b communicates with the hollow formed by the narrow portion 34 and the annular portion 35, and is arranged in the z direction.

As shown in FIG. 1 and FIG. 2, the magneto electric converter 10 is indicated by a block, and the magneto electric converter 10 is opposed to the opposing portion 31 in the z direction. More specifically, the magneto electric converter 10 is opposed to and spaced apart from the gap 36b in the z direction. The magneto electric converter 10 is arranged to face the hollow formed by the narrow portion 34 and the annular portion 35 via the gap 36b in the z direction. Therefore, the magnetic field to be measured mainly generated from the current flowing through the tip portion having the two tip surfaces 36a of the opposing portion 31 penetrates the magneto electric converter 10.

As described above, the conductive bus bar 30 extends in the y direction. Therefore, a current flows in the conductive bus bar 30 in the y direction. Due to the flow of the current in the y direction, a magnetic field to be measured is generated in the circumferential direction around the y direction according to Ampere's law. The magnetic field to be measured flows annularly around the conductive bus bar 30 as a center on a plane defined by the x direction and the z direction. The magneto electric converter 10 detects a component of the measurement object magnetic field along the x direction.

An alternating current flows through the conductive bus bar 30. When the frequency of the alternating current increases, the alternating current tends to flow through the surface layer of the conductive bus bar 30 due to a skin effect. As a result, the current density of the alternating current flowing in the surface layer of the conductive bus bar 30 increases.

This alternating current flows not only in the narrow portion 34 but also in the annular portion 35. Therefore, the current density of the alternating current flowing in the surface layer of the annular portion 35 increases. More specifically, the current density of the alternating current flowing through the surface layer on the two tip surfaces 36a side increases. Therefore, the magnetic field generated from the alternating current flowing through the surface layer on the two tip surfaces 36a side having the high current density penetrates through the magneto electric converter 10 disposed to face the gap 36b between the two tip surfaces 36a.

<Dimensions of Current Sensor>

Next, the dimensional relationship of the current sensor 100 will be described. As shown in FIG. 2, the length of the narrow portion 34 in the x direction is defined as lc. As described above, the extension portion 36 extends from each of the two sides of the narrow portion 34 arranged in the x direction. The extension portion 36 extends in the circumferential direction. That is, while extending in the z direction, the extension portion 36 is once separated from the narrow portion 34 in the x direction, and then extends so as to approach the narrow portion 34 in the x direction. The longest separation length lx in the x direction between the two extension portions 36 is longer than the length lc of the narrow portion 34 in the x direction.

As described above, the tip surfaces 36a of the two extension portions 36 face each other while being separated from each other in the x direction. The distance lg in the x direction between the two tip surfaces 36a is shorter than the length lc in the x direction of the narrow portion 34. In other words, the length (i.e., the gap length) lg of the gap 36b between the two tip surfaces 36a in the x direction is shorter than the length lc of the narrow portion 34 in the x direction.

The distance between the gap 36b and the magneto electric converter 10 in the z direction is defined as ld. The length of the hollow of the opposing portion 31 in the z direction is defined as lz. The separation distance ld is shorter than the length lz. Note that the separation distance ld may be shorter or longer than the separation distance (i.e., the thickness) between the one surface 30a and the back surface 30b of the conductive bus bar 30. The separation distance ld may be shorter or longer than the gap length lg.

The length of the magneto electric converter 10 in the x direction is shorter than the gap length lg of the gap 36b. The magneto electric converter 10 faces the center of the gap 36b, disposed in the x direction, in the z direction. Therefore, the magneto electric converter 10 faces the gap 36b in the z direction, and is not aligned with the two tip surfaces 36a for constituting the gap 36b in the z direction. Alternatively, a configuration in which the length of the magneto electric converter 10 in the x direction is longer than the gap length lg may be employed. That is, a configuration in which the magneto electric converter 10 is aligned with the two tip surfaces 36a in the z direction may be adopted. The length of the magneto electric converter 10 in the x direction is specifically about 1 mm.

As shown in FIG. 2, in the opposing portion 31, the annular portion 35 has a larger cross-sectional area (i.e., the current-flowing cross-sectional area) in the y-direction than in the narrow portion 34. As a result, energization from the narrow portion 34 to the annular portion 35 is promoted.

<Magnetic Field Strength>

Next, while the lengths lc, lx, lg, ld, and lz and the size of the magneto electric converter 10 are not changed and the length ly of the narrow portion 34 in the y direction shown in FIG. 1 is changed, the measurement result of the intensity of the magnetic field (i.e., the transmission magnetic field) transmitted through the magneto electric converter 10 will be described with reference to FIG. 3.

Figure 3:
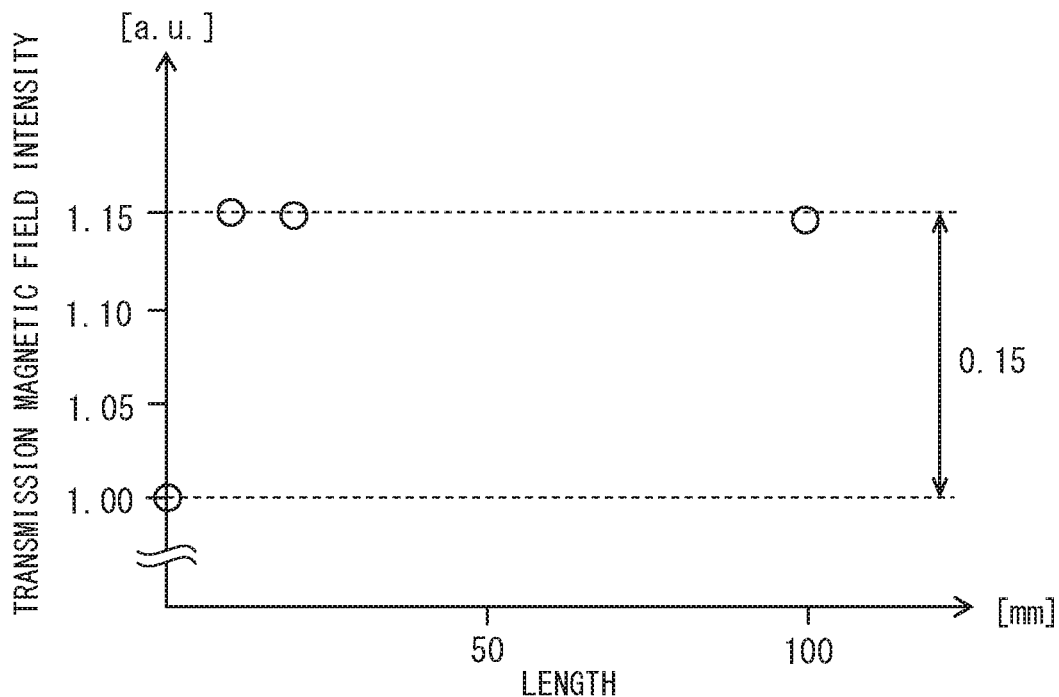
FIG. 3 is a graph showing the relationship between the intensity of a transmission magnetic field and the shape of an opposing portion.

The vertical axis in FIG. 3 indicates the intensity of the transmission magnetic field (i.e, magnetic field strength). The horizontal axis indicates the length ly. The unit on the vertical axis is an arbitrary unit in which the intensity of the transmission magnetic field when the length ly is zero is defined as a reference value of 1.00. The unit of the horizontal axis is "mm".

As clearly shown in FIG. 3, when the length ly is zero, that is, when the annular portion 35 is not formed in the narrow portion 34, the intensity of the transmission magnetic field becomes 1.00. On the other hand, when the length ly is about 10 mm, the intensity of the transmission magnetic field is 1.15. Thus, when the annular portion 35 is formed in the narrow portion 34 to some extent, the intensity of the transmission magnetic field increases by about 15%.

Here, in obtaining the measurement results shown in FIG. 3, the cross-sectional area of the opposing portion 31 orthogonal to the y direction in a case where the annular portion 35 is not formed in the narrow portion 34 is made equal to the cross-sectional area of the opposing portion 31 orthogonal to the y direction in a case where the annular portion 35 is formed in the narrow portion 34 The current-flowing cross-sectional area of the opposing portion 31 is equal between the case where the annular portion 35 is not provided and the case where the annular portion 35 is provided.

<Phase Shift>

Next, with reference to FIG. 4, a measurement result of the phase shift amount of the transmission magnetic field will be described when the length ly of the narrow portion 34 in the y direction is changed while the various lengths lc, lx, lg, ld, and lz are unchanged. This phase shift indicates the amount of phase shift of the transmission magnetic field when a high-frequency AC current that provides the skin effect flows with respect to the transmission magnetic field when a low-frequency AC current that provides the negligible small skin effect flows.

The frequency difference between the flowing alternating currents is 2000 Hz. The vertical axis in FIG. 4 indicates the phase shift amount of the transmission magnetic field. The horizontal axis indicates the length ly. The unit of the vertical axis is "degree". The unit of the horizontal axis is "mm".

Figure 4:
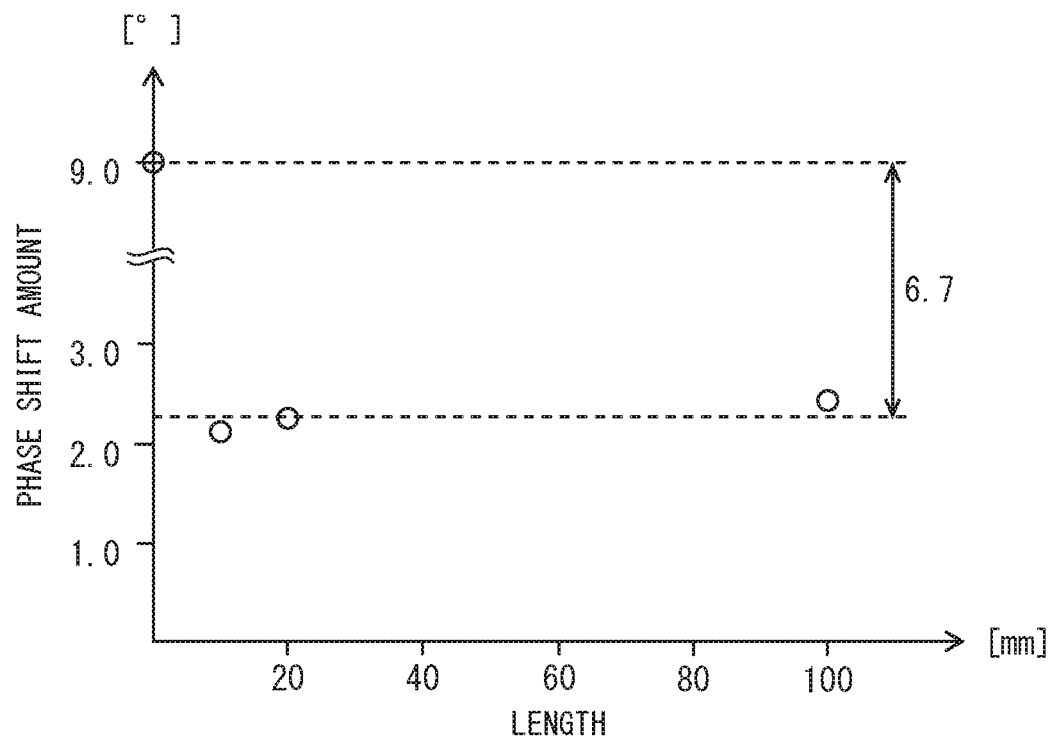
FIG. 4 is a graph showing a relationship between a phase shift amount of a transmission magnetic field and a shape of an opposing portion.

As clearly shown in FIG. 4, when the length ly is zero, that is, when the annular portion 35 is not formed in the narrow portion 34, the phase shift amount of the transmission magnetic field becomes 9°. On the other hand, when the length ly is about 10 mm, the phase shift amount of the transmission magnetic field is about 2.3°. In this way, when the annular portion 35 is formed in the narrow portion 34 to some extent, the phase shift amount of the transmission magnetic field is reduced by about 6.7°. That is, the phase shift amount is reduced by 74%.

Figure 5:
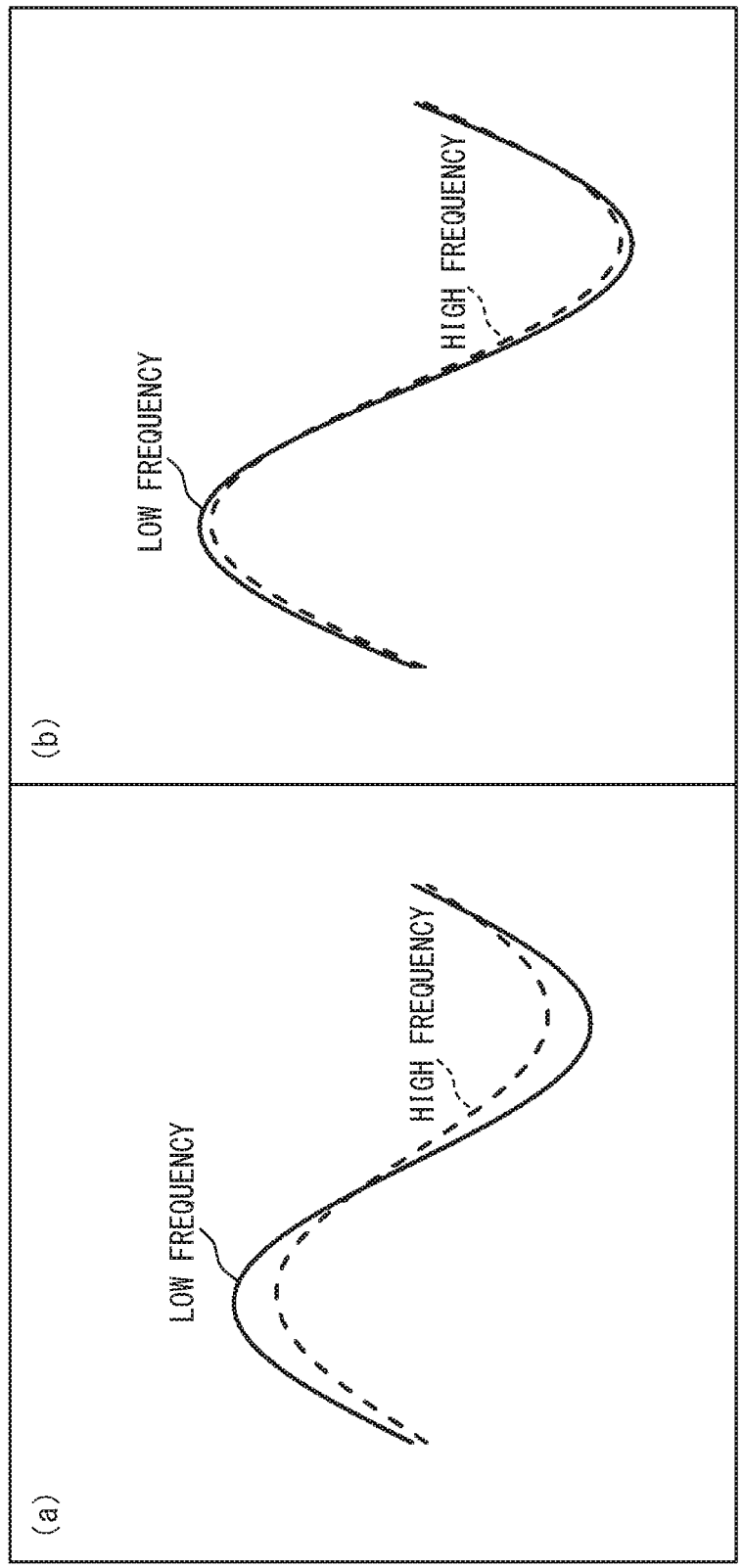
FIG. 5 is a diagram showing a phase shift amount of a transmission magnetic field.

Next, the phase shift amount of the transmission magnetic field will be described with reference to FIG. 5 when the alternating currents having different frequencies are applied to the opposing portion 31 in a case where the annual portion 35 is formed in the narrow portion 34 and in a case where the annual portion 35 is not formed in the narrow portion 34 although the energization cross-sectional areas of both cases are equal to each other.

The frequency difference between the flowing alternating currents is 5000 Hz. A solid line indicates a transmission magnetic field detected when a low-frequency AC current flows, and a broken line indicates a transmission magnetic field detected when a high-frequency AC current flows. Column (a) of FIG. 5 shows a transmission magnetic field when the annular portion 35 is not formed in the narrow portion 34. Column (b) of FIG. 5 shows the transmission magnetic field when the annular portion 35 is formed in the narrow portion 34.

When the annular portion 35 is not formed in the narrow portion 34, the phase shift amount between the transmission magnetic field when a low-frequency AC current flows and the transmission magnetic field when a high-frequency AC current flows is 9°. When the annular portion 35 is formed in the narrow portion 34, the phase shift amount between the transmission magnetic field when a low-frequency AC current flows and the transmission magnetic field when a high-frequency AC current flows is 2°.

As described above, when the opposing portion 31 includes not only the narrow portion 34 facing in the z direction but also the annular portion 35 having the gap 36b, the amount of phase shift of the transmission magnetic field is reduced.

Figure 6:
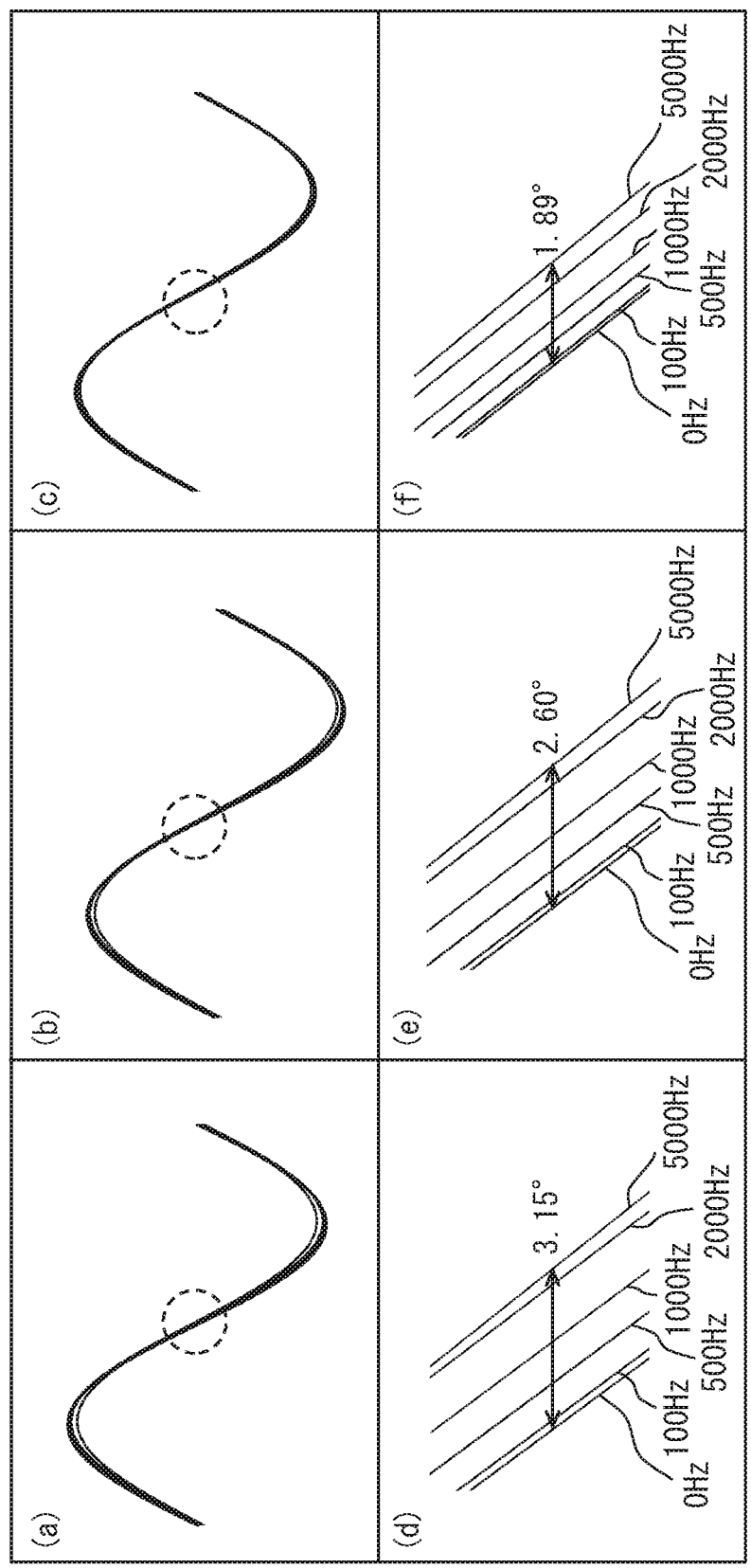
FIG. 6 is a diagram showing a relationship between a phase shift amount of a transmission magnetic field and a gap length.

Next, FIG. 6 shows a transmission magnetic field when the gap length lg is changed while the above-described various lengths lc, lx, ld, lz, and ly are unchanged. The gap length lg is changed to 0.0 mm, 0.5 mm, and 1.5 mm. Therefore, the transmission magnetic field shown in FIG. 6 is indicated in a case where the opposing portion 31 has a cylindrical shape without the gap 36b, in a case where the gap length lg is shorter than the magneto electric converter 10, and in a case where the gap length lg is longer than the magneto electric converter 10. In these various features, an alternating current of 0 Hz, 100 Hz, 500 Hz, 1000 Hz, 2000 Hz, or 5000 Hz is applied to the conductive bus bar 30. Note that "0 Hz" means an approximate value, specifically, $1 \times 10^{-8}$ Hz.

The column (a) of FIG. 6 shows the transmission magnetic field when the gap length lg is 0.0 mm. The column (b) of FIG. 6 shows the transmission magnetic field when the gap length lg is 0.5 mm. The column (c) of FIG. 6 shows the transmission magnetic field when the gap length lg is 1.5 mm.

The column (d) of FIG. 6 shows the transmission magnetic field in the region surrounded by the broken line shown in column (a) of FIG. 6. The column (e) of FIG. 6 shows the transmission magnetic field in the region surrounded by the broken line shown in the column (b) of FIG. 6. The column (f) of FIG. 6 shows the transmission magnetic field in the region surrounded by the broken line shown in the column (c) of FIG. 6.

As clearly shown in FIG. 6, regardless of the presence or absence of the gap length lg and the value of the gap length lg, as the frequency of the alternating current increases, the phase difference between the transmission magnetic field of the low-frequency alternating current and the transmission magnetic field of the high-frequency alternating current increases. However, the increasing value of the phase difference depends on the gap length lg.

As shown in columns (a) and (d) of FIG. 6, when the gap length lg is 0.0 mm, the phase shift amount between the transmission magnetic field when the lowest frequency AC current flows and the transmission magnetic field the highest frequency AC current is 3.15°.

As shown in columns (b) and (e) of FIG. 6, when the gap length lg is 0.5 mm, the phase shift amount between the transmission magnetic field when the lowest frequency AC current flows and the transmission magnetic field the highest frequency AC current is 2.60°.

As shown in columns (c) and (f) of FIG. 6, when the gap length lg is 0.5 mm, the phase shift amount between the transmission magnetic field when the lowest frequency AC current flows and the transmission magnetic field the highest frequency AC current is 1.89°.

As described above, when the gap length lg is present, that is, when the opposing portion 31 is not a continuous ring in the circumferential direction but a ring having the gap 36b, the phase shift amount of the transmission magnetic field is reduced. Further, when the gap length lg is longer than the magneto electric converter 10, the amount of phase shift of the transmission magnetic field is effectively reduced.

<Operations and Advantages of Current Sensor>
<Intensity of Transmission Magnetic Field>

As described above, the magneto electric converter 10 is disposed in the z direction so as to face the gap 36b formed by the two tip surfaces 36a of the conductive bus bar 30. As a result, the measurement object magnetic field generated from the measurement object current flowing intensively on the surface layers on the two tip surfaces 36a side of the conductive bus bar 30 according to the skin effect passes through the magneto electric converter 10. As a result, as shown in FIG. 3, the density (i.e., the intensity) of the magnetic field to be measured passing through the magneto electric converter 10 is effectively increased.

Figure 7:
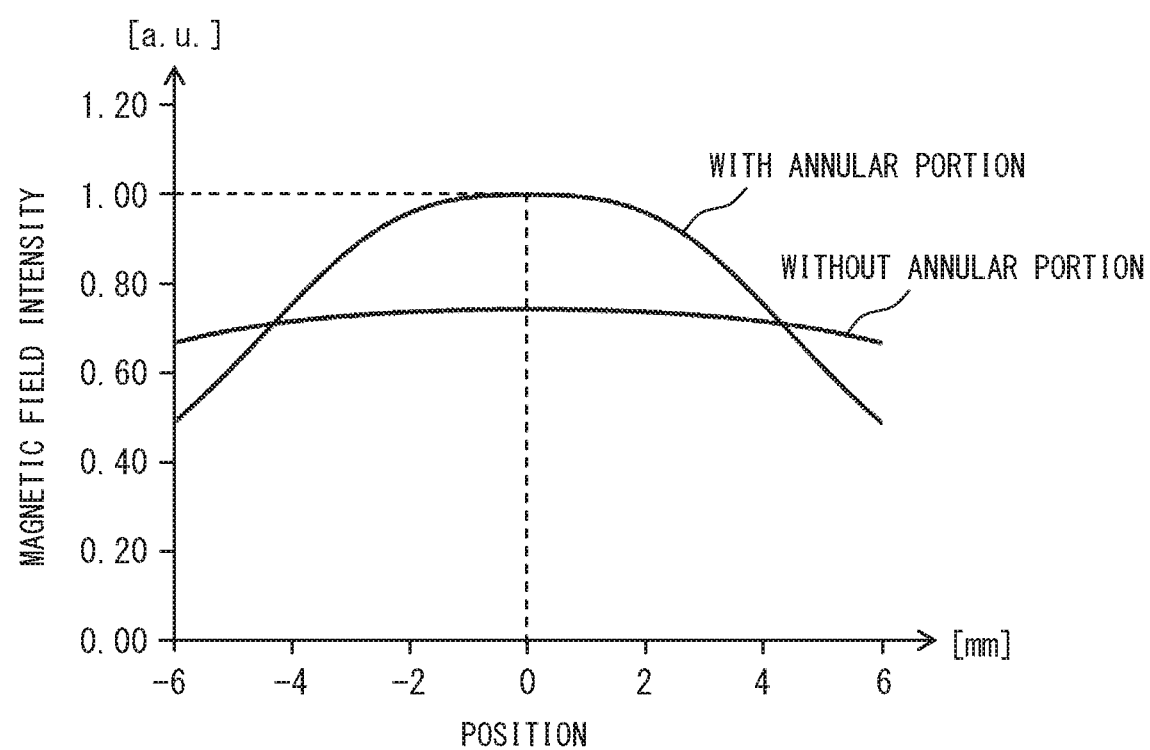
FIG. 7 is a graph showing a density distribution of a magnetic field to be measured.

The effective increase in the intensity of the magnetic field to be measured passing through the magneto electric converter 10 also occurs when a direct current flows through the conductive bus bar 30. FIG. 7 shows the intensity distribution of the magnetic field to be measured in a case where the opposing portion 31 has the narrow portion 34 without the annular portion 35 and in a case where the opposing portion 31 has the narrow portion 34 with the annular portion 35 under a condition that the direct current is applied to the opposing portion 31 and the energization cross-sectional area is the same in both cases.

The vertical axis of FIG. 7 indicates the intensity of the magnetic field to be measured. The horizontal axis indicates the position in the x direction when the magneto electric converter 10 (specifically, the gap 36b) is defined as the center. The unit on the vertical axis is an arbitrary unit in which the maximum intensity of the magnetic field to be measured is defined as a reference value of 1.00. The unit of the horizontal axis is "mm".

As clearly shown in FIG. 7, when the annular portion 35 is formed in the narrow portion 34, the measurement object magnetic field (i.e., the transmission magnetic field) at the position of x=0.0 mm is larger than the case where the annular portion 35 is not formed in the narrow portion 34. Specifically, the transmission magnetic field increases by about 31%. As described above, even when the current to be measured is a direct current, the intensity of the transmission magnetic field increases.

<Phase Shift of Transmission Magnetic Field>

As described with reference to FIGS. 4 and 5, when the annular portion 35 is formed in the narrow portion 34, the phase shift amount of the transmission magnetic field is reduced as compared with the case where the annular portion 35 is not formed in the narrow portion 34. In addition, as described with reference to FIG. 6, when the annular portion 35 has an annular shape having the gap 36b, the phase shift amount of the transmission magnetic field is reduced, compared with a case where the annular portion 35 does not have the gap 36b and the opposing portion 31 has a continuous ring shape in the circumferential direction. Further, when the gap length lg is longer than the magneto electric converter 10, the amount of phase shift of the transmission magnetic field is effectively reduced.

This suppresses a phase difference from generating between the measurement object current detected by the current sensor 100 and the measurement object current actually flowing through the conductive bus bar 30. Thus, the deviation of the target torque value calculated by the electronic control unit based on the measurement current detected by the current sensor 100 is suppressed. Further, the unstable driving state of the motor is suppressed.

<Dimensions of Current Sensor>

The distance ld in the z direction between the gap 36b and the magneto electric converter 10 is shorter than the length lz of the hollow of the opposing portion 31 in the z direction. This suppresses a reduction in the intensity of the measurement magnetic field generated from the conductive bus bar 30 and transmitted through the magneto electric converter 10 due to the skin effect.

Since the extension portion 36 extends in the circumferential direction, the longest separation length lx in the x direction between the two extension portions 36 is longer than the length lc of the narrow portion 34 in the x direction. Thereby, compared with the configuration in which the extension portion 36 simply extends in the z direction, the energization cross-sectional area of the extension portion 36 is increased. Therefore, the electric resistance of the opposing portion 31 decreases. The local heat generation in the opposing portion 31 is suppressed. The fluctuation of the resistance of the magneto resistive element provided in the magneto electric converter 10 is suppressed due to heat transfer from the opposing portion 31 to the magneto electric converter 10. Further, the decrease in the detection accuracy of the measurement object current is suppressed.

In the opposing portion 31, the annular portion 35 has a larger current-flowing cross-sectional area than the narrow portion 34. As a result, energization from the narrow portion 34 to the annular portion 35 is promoted. The reduction of the current density of the measurement object current flowing through the annular portion 35 is suppressed.

While preferred embodiments of the present disclosure have been described above, the present disclosure is not limited in any way by the embodiments described above, and may be carried out with various modifications without departing from the scope of the subject matter of the present disclosure.

(First Modification)

Figure 8:
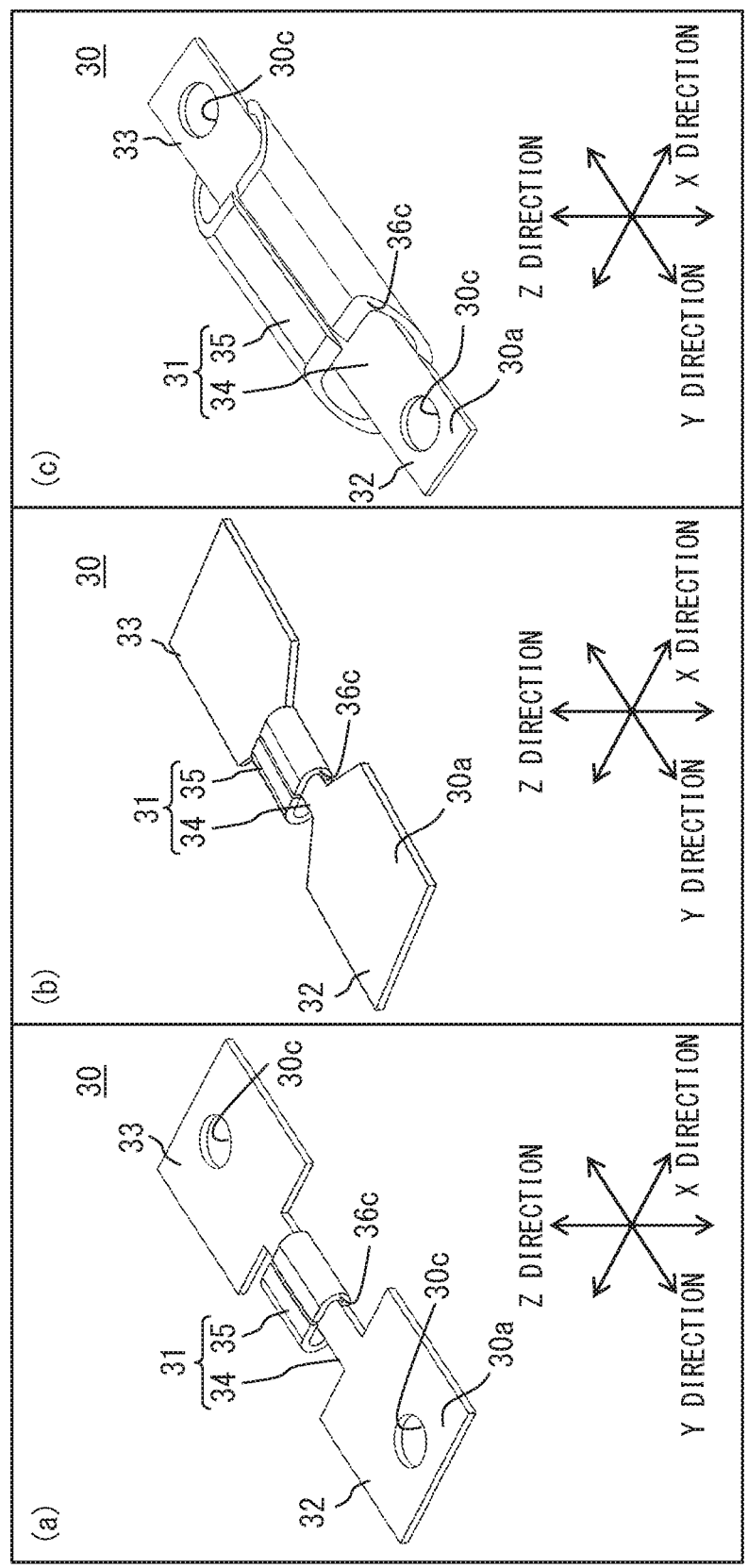
FIG. 8 is a diagram showing a modification example of the conductive bus bar.

In the present embodiment, an example in which the conductive bus bar 30 is a part of the energization bus bar is described. Alternatively, it is also possible to adopt a configuration in which the conductive bus bar 30 and the energization bus bar are separated from each other. In this case, for example, as shown in columns (a) and (c) of FIG. 8, it is also possible to adopt a configuration that a through hole 30c for penetrating the one surface 30a and the back surface 30b is formed in each of the first connection portion 32 and the second connection portion 33. A bolt is passed through the through-hole 30c, and the tip of the bolt is fastened to the energization bus bar. In this case, the conductive bus bar 30 and the energization bus bar are mechanically and electrically connected to each other.

(Second Modification)

In the present embodiment, an example has been described in which each of the first connection portion 32 and the second connection portion 33 forms a rectangular shape on a plane perpendicular to the z direction. Alternatively, as shown in the column (b) of FIG. 8, the configuration may also be adopted such that each of the first connection portion 32 and the second connection portion 33 has a slope whose length in the x direction gradually decreases toward the connecting portion with the narrow portion 34. Thus, the flow of the current from the first connection portion 32 to the narrow portion 34 and the flow of the current from the second connection portion 33 to the narrow portion 34 are prevented from being limited.

(Third Modification)

In the present embodiment, as shown in FIG. 1, an example is shown in which the tip surfaces 36c of the two extension portions 36 in the annular portion 35 in the y direction face the y direction. Alternatively, as shown in column (c) of FIG. 8, the tip surface 36c may have a slope in which the length in the z direction gradually increases as approaching the center of the annular portion 35 in the y direction. This makes it easier for the current to flow from the first connection portion 32 side to the annular portion 35 and to flow from the second connection portion 33 side to the annular portion 35. Therefore, a reduction in the amount of the measurement object current flowing through the annular portion 35 is suppressed.

In the present embodiment, an example has been shown in which the length of the narrow portion 34 in the x direction is shorter than the first connection portion 32 and the second connection portion 33. Alternatively, as shown in column (c) of FIG. 8, a configuration in which the length of each of the narrow portion 34, the first connection portion 32, and the second connection portion 33 in the x direction may be adopted.

In the present embodiment, the magnitude relation of the energization cross-sectional areas of the first connection portion 32 and the second connection portion 33 and the opposing portion 31 is not particularly described. For example, as shown in column (c) of FIG. 8, a configuration in which the opposing portion 31 has a larger energization cross-sectional area than each of the first connection portion 32 and the second connection portion 33 may be adopted.

(Fourth Modification)

Figure 9:
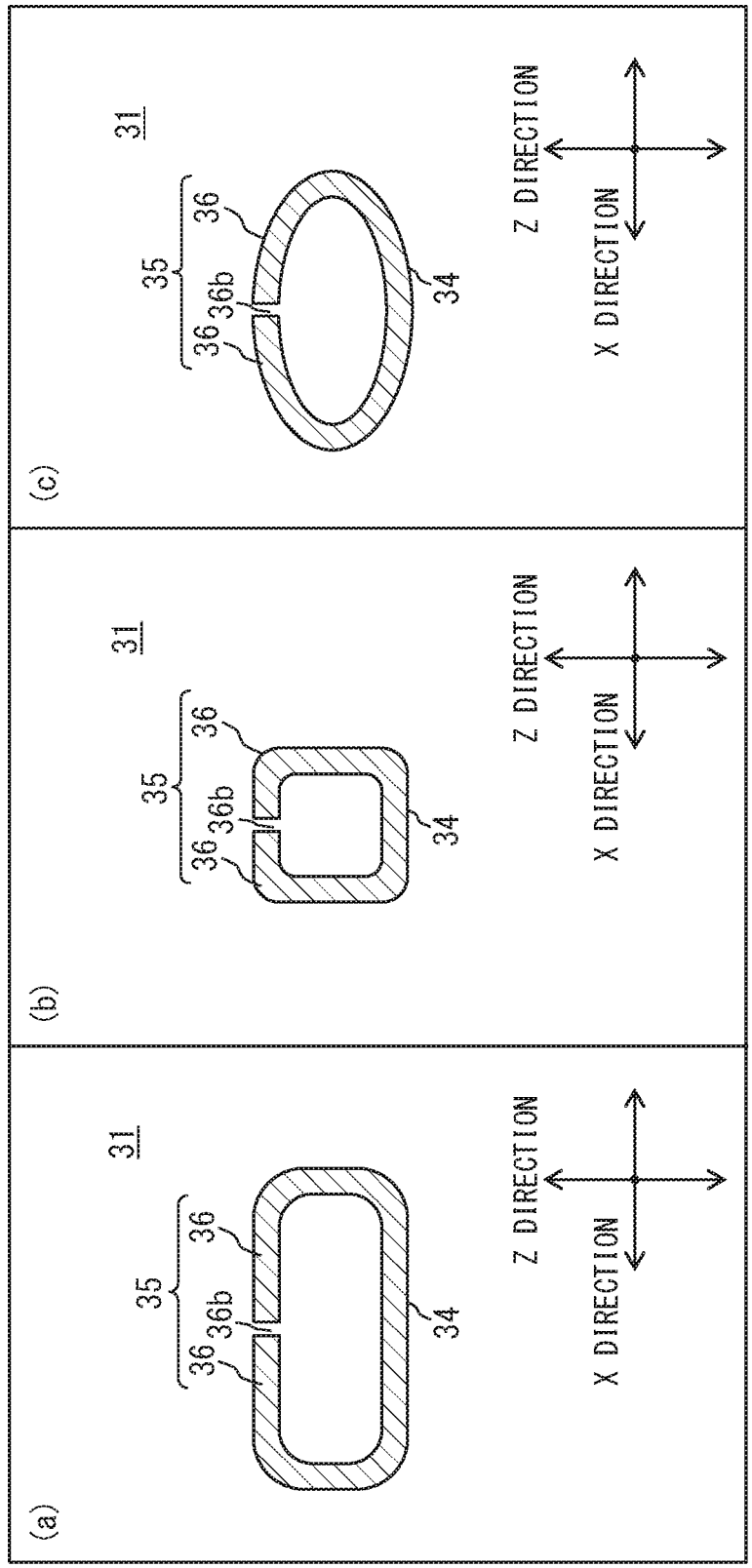
FIG. 9 is a diagram showing a modification example of the conductive bus bar.

In the present embodiment, an example in which the extension portion 36 extends in the circumferential direction from the narrow portion 34 has been described. Alternatively, as shown in columns (a) and (b) of FIG. 9, the extension portion 36 may have a shape extending in the z direction from the narrow portion 34. Alternatively, a rectangular or square cross section of the extension portion 36 facing the hollow in the y-direction may be employed. As shown in the column (c) of FIG. 9, the cross section of the extension portion 36 facing the hollow in the y-direction may have an elliptical shape.

(Other Modifications)

In the present embodiment, an example in which the current sensor 100 is applied to detect the current of the energization bus bar connecting the inverter and the stator coil has been described. Alternatively, the application of the current sensor may not limited to the above example. For example, a configuration in which the current sensor 100 is applied to the detection of a current in a power line connecting the battery and the converter may be employed. In this case, the current sensor 100 detects a direct current.

(Reference Example)

Figure 10:
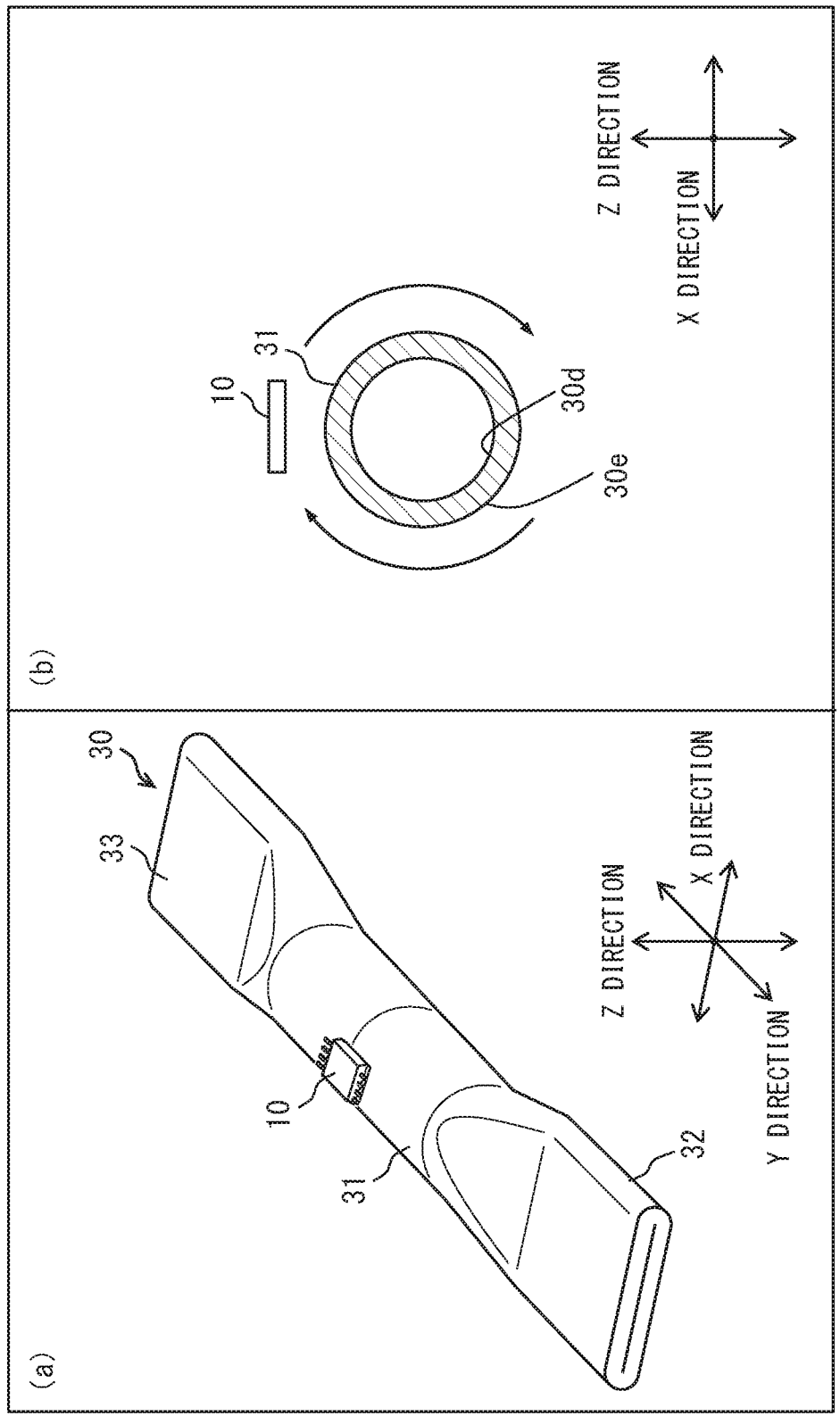
FIG. 10 is a diagram showing a state in which a magneto electric converter is arranged to face a cylindrical conductive bus bar.

FIG. 10 shows the current sensor 100 in the case where the conductive bus bar 30 has a cylindrical shape for reference. As shown in the column (a) of FIG. 10, the magneto electric converter 10 is arranged to be opposed to and spaced apart from the conductive bus bar 30 having a cylindrical shape in the z-direction. In this configuration, as shown by a solid arrow in the column (b) of FIG. 10, the magnetic field to be measured flowing in the circumferential direction according to Ampere's law passes through the magneto electric converter 10.

When an alternating current flows through the cylindrical conductive bus bar 30, the current to be measured may concentrate and flow in the surface layer of each of the inner wall surface 30d side and the outer wall surface 30e side of the conductive bus bar 30 constituting the cylinder due to the skin effect.

Here, the depth D of the surface layer through which the current to be measured flows intensively due to the skin effect depends on the frequency f of the current to be measured, the magnetic permeability μ of the conductive bus bar 30, and the magnetic permeability σ of the conductive bus bar 30. Specifically, it is expressed as $D=(\pi f \mu \sigma)^{-1/2}$.

As described above, the depth D of the surface layer in which the current flows in a concentrated manner depends on the frequency f of the measurement object current. The higher the frequency f, the shallower the depth D of the surface layer in which the current flows in a concentrated manner. When the maximum value of the frequency of the current to be measured is defined as F, the shortest depth Dm of the surface layer through which the current flows in a concentrated manner is expressed as $(\pi F \mu \sigma)^{-1/2}$.

When the thickness t between the inner wall surface 30d and the outer wall surface 30e of the conductive bus bar 30 is longer than the shortest depth Dm, the density distribution of the measurement object current flowing through the conductive bus bar 30 is deviated between the surface layer side and the inside. On the other hand, when the thickness t is equal to or less than the shortest depth Dm, the density distribution of the measurement object current flowing through the conductive bus bar 30 is less likely to be biased.

Thus, the thickness t of the cylindrical conductive bus bar 30 is set to be equal to or shorter than the shortest depth $Dm=(\pi F\mu\sigma)^{-1/2}$. This suppresses a change in the density distribution of the measurement object magnetic field due to the skin effect. A change in the phase or the like of the measurement object magnetic field transmitted through the magneto electric converter 10 due to a change in the frequency of the measurement object current is suppressed. Further, the decrease in the detection accuracy of the measurement object current is suppressed.

The thickness of the opposing portion 31 of the conductive bus bar 30 that faces the magneto electric converter 10 may be set to be equal to or shorter than the shortest depth $Dm=(\pi F\mu\sigma)^{-1/2}$, and the thickness of each of the first connection portion 32 and the second connection portion 33 may be set to be thicker than the shortest depth Dm. Further, as shown in FIG. 10, it is also possible to adopt a configuration in which the hollow of each of the first connection portion 32 and the second connection portion 33 is smaller than the hollow of the opposing portion 31.

The present disclosure has been described based on examples, but it is understood that the present disclosure is not limited to the examples or structures. The present disclosure covers various modification examples and equivalent arrangements. In addition, various combinations and forms, and further, other combinations and forms including only one element, or more or less than these elements are also within the scope and the scope of the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A current sensor comprising:
    a conductive member through which a measurement object current flows in a predetermined direction; and
    a magneto electric converter that faces the conductive member in an intersecting direction that intersects with the predetermined direction and is spaced apart from the conductive member, wherein:
    an opposing portion of the conductive member facing the magneto electric converter has an annular shape in which two tip surfaces face each other via a gap around the predetermined direction;
    wherein the opposing portion of the conductive member is a part of the conductive member, and is continuously integrated with the conductive member; and
    the magneto electric converter is opposed to a hollow portion arranged in the opposing portion having the annular shape via the gap in the intersecting direction.

2. The current sensor according to claim 1, wherein:
    a distance between the magneto electric converter and the gap in the intersecting direction is shorter than a length of the hollow portion in the intersecting direction.

3. The current sensor according to claim 1, wherein:
    the gap has a length in a lateral direction that intersects the predetermined direction and the intersecting direction, respectively; and
    the length is longer than the magneto electric converter.

4. The current sensor according to claim 1, wherein:
    the magneto electric converter is spaced apart from the gap by a predetermined distance in the intersecting distance.

5. The current sensor according to claim 1, wherein the magneto electric converter is adapted to be mounted on a first main surface of a wiring board, the first main surface being arranged to face the conductive member in the intersecting direction.

6. The current sensor according to claim 1, wherein the opposing portion has a first connection portion and a second connection portion, and narrow portion therebetween, a width in a horizontal direction of the narrow portion being shorter than a width in the horizontal direction of the first connection portion and the second connection portion.

\* \* \* \* \*